United States Patent
Chiu et al.

(10) Patent No.: US 11,303,009 B2
(45) Date of Patent: Apr. 12, 2022

(54) PACKAGES FOR ADVANCED ANTENNA SYSTEMS

(71) Applicant: Qorvo US, Inc., Greensboro, NC (US)

(72) Inventors: Anthony Chiu, Richardson, TX (US); Bror Peterson, Fairview, TX (US); Michael Arnold, Westminster, TX (US)

(73) Assignee: QORVO US, INC., Greensboro, NC (US)

( * ) Notice: Subject to any disclaimer, the term of this patent is extended or adjusted under 35 U.S.C. 154(b) by 119 days.

(21) Appl. No.: 16/653,387

(22) Filed: Oct. 15, 2019

(65) Prior Publication Data

US 2021/0050650 A1 Feb. 18, 2021

Related U.S. Application Data

(60) Provisional application No. 62/886,044, filed on Aug. 13, 2019.

(51) Int. Cl.
*H01Q 1/22* (2006.01)
*H01L 23/31* (2006.01)

(52) U.S. Cl.
CPC .......... *H01Q 1/2283* (2013.01); *H01L 23/31* (2013.01); *H01L 23/3121* (2013.01); *H01Q 1/22* (2013.01)

(58) Field of Classification Search
CPC .... H01Q 1/2283; H01Q 1/241; H01Q 21/065; H01Q 1/38; H01Q 1/22; H01L 23/3121; H01L 23/3128; H01L 23/562; H01L 23/31
USPC ................................................ 343/700 MS
See application file for complete search history.

(56) References Cited

U.S. PATENT DOCUMENTS

| | | | |
|---|---|---|---|
| 2012/0289757 A1* | 11/2012 | Boyden | A61N 1/0534 600/1 |
| 2016/0049723 A1* | 2/2016 | Baks | H01Q 1/2291 343/848 |
| 2017/0040266 A1* | 2/2017 | Lin | H01L 23/5383 |
| 2018/0090467 A1* | 3/2018 | Kim | H01L 25/18 |

(Continued)

OTHER PUBLICATIONS

Atkins, P, "Use of Spectrum Bands Above 24 GHz for Mobile Radio Services, (GN Docket No. 14-177, IB Docket Nos. 15-256 and 97-95, RM-11664, and WT Docket No. 10-112)" United States Department of Commerce, National Telecommunications and Information Administration, Jul. 12, 2016, downloaded Mar. 4, 2020 from pps.fcc.gov/edocs_public/attachmatch/FCC-16-89A1.pdf, 19 pages.

(Continued)

*Primary Examiner* — Hai V Tran
(74) *Attorney, Agent, or Firm* — Withrow & Terranova, P.L.L.C.

(57) ABSTRACT

System-in-package (SiP) devices are disclosed that include power amplifiers and controllers such as beamformer integrated circuits that are packaged together. Packaging and thermal management configurations are disclosed that allow a plurality of power amplifiers and a beamformer integrated circuit to operate efficiently while in close proximity to one another. SiP devices are disclosed that include heat spreaders that are incorporated within the SiP devices and exposed at top surfaces of the SiP devices to effectively dissipate heat. Heat spreaders may be provided as part of a lead frame that allows multiple SiP devices to be uniformly assembled with dimensions sized for high frequency applications, including millimeter wave operation.

21 Claims, 10 Drawing Sheets

(56) References Cited

U.S. PATENT DOCUMENTS

| | | | | |
|---|---|---|---|---|
| 2018/0286822 | A1* | 10/2018 | Kim | H01L 23/5386 |
| 2019/0279960 | A1* | 9/2019 | Karhade | H01L 25/50 |
| 2020/0194893 | A1* | 6/2020 | Im | H01L 23/5387 |
| 2020/0357752 | A1* | 11/2020 | Yazzie | H01L 23/562 |
| 2020/0395336 | A1* | 12/2020 | Okano | H01L 25/0655 |
| 2020/0412017 | A1* | 12/2020 | Park | H01Q 21/24 |

OTHER PUBLICATIONS

Kim, B. et al., "39GHz GaN front end MMIC for 5G applications," 2017 IEEE Compound Semiconductor Integrated Circuit Symposium (CSICS), Miami, FL, 2017, pp. 1-4.

Molisch, A. et al., "Hybrid Beamforming for Massive MIMO—A Survey," arXiv: 1609.05078v2, Apr. 30, 2017, 13 pages.

Peterson, Bror, et al., "5G Fixed Wireless Access Array and RF Front-End Trade-Offs," Microwave Journal, Feb. 2018, Horizon House Publications, 9 pages.

Sadhu, B. et al., "A 28GHz 32-Element Phased-Array Transceiver IC with Concurrent Dual Polarized Beams and 1.4 Degree Beamsteering Resolution for 5G Communication," 2017 IEEE International Solid-State Circuits Conference (ISSCC), San Francisco, Calif, 2017, pp. 128-129.

Unknown, "IMT Vision—Framework and Overall Objectives of the Future Development of IMT for 2020 and Beyond," International Telecommunications Union, ITUR Radiocommunications Sector of ITU, Sep. 2015, downloaded Mar. 3, 2020 from www.itu.int/dms_pubrec/itu-r/rec/m/R-REC-M.2083-0-201509-I!!PDF-E.pdf, 21 pages.

Unknown, "QPF4005 37-40.5 GaN Dual Channel FEM Datasheet," Rev. G, Nov. 20, 2018, downloaded Mar. 3, 2020 from https://www.qorvo.com/products/p/QPF4005,22 pages.

Unknown, "Studies on Frequency-Related Matters for International Mobile Telecommunications Identification Deluding Possible Additional Allocations to the Mobile Services on a Primary Basis in Portion(s) of the Frequency Range 24.25 and 86 GHz for Future Development of IMT-2020 and Beyond," International Telecommunications Union, Resolution 238 (WRC-15), The World Radiocommunications Conference (Geneva, 2015), downloaded Mar. 3, 2020 From www.itu.int/dms_pub/itu-r/oth/0c/0a/R0C0A00000C0014PDFE.pdf, 3 pages.

Unknown, "3rd Generation Partnership Project; Technical Specification Group Radio Access Network; Study on channel model for frequencies from 0.5 to 100 GHz (Release 14)," 3GPP TR 38.901, V14.2.1. Sep. 2017, 3GPP Organizational Partners, 91 pages.

* cited by examiner

PACKAGES FOR ADVANCED ANTENNA SYSTEMS

RELATED APPLICATIONS

This application claims the benefit of provisional patent application Ser. No. 62/886,044, filed Aug. 13, 2019, the disclosure of which is hereby incorporated herein by reference in its entirety.

FIELD OF THE DISCLOSURE

The present disclosure relates to packages for advanced antenna systems, and particularly to system-in-package devices for advanced antenna systems and related methods.

BACKGROUND

Wireless communication networks have continued to evolve in order to keep up with ever increasing data transmission demands of modern technology. With each new generation of cellular network technology, higher integration and smaller device sizes are needed to provide improved data capacity, connectivity, and coverage. Advanced cellular networks, including fifth generation (5G) and beyond, seek to leverage a broader range of frequency bands and power levels to deliver improved speed and efficiency of data transmissions with lower latency. 5G technology may be implemented in an overlaying manner with existing cellular networks to meet data transmission demands for advanced applications. Innovations enabled by 5G may include massive internet of things devices for machine-to-machine communications, mission critical services, and enhanced mobile broadband (eMBB). Mission critical services may include autonomous driving, autonomous mass transit systems, industrial automation, remote healthcare, and smart grid monitoring and control. Applications related to eMBB may enable densification of mobile networks, fixed wireless access, augmented reality, virtual reality, and gaming among others.

As advanced cellular networks expand into the millimeter wave spectrum, infrastructure challenges exist to implement such higher frequency ranges within existing cellular network footprints. These demands continually raise the complexity of wireless devices and systems and there is a constant need for performance improvements. As advancements in modern wireless technology progress, the art continues to seek improved devices and systems capable of overcoming such challenges.

SUMMARY

The present disclosure relates to packages for advanced antenna systems, and particularly to system-in-package (SiP) devices for advanced antenna systems and related methods. Devices are disclosed that include power amplifiers and controllers such as beamformer integrated circuits that are integrated together into SiP device arrangements. Packaging and thermal management configurations are disclosed that allow a plurality of power amplifiers and a beamformer integrated circuit to operate efficiently while in close proximity to one another. In certain embodiments, heat spreaders are disclosed that are incorporated within SiP devices and exposed at top surfaces of the SiP devices to effectively dissipate heat. Heat spreaders may be provided as part of a lead frame that allows multiple SiP devices to be uniformly assembled with dimensions sized for high frequency applications, including millimeter wave operation.

In one aspect, a SiP device comprises: a substrate comprising a first face and a second face that opposes the first face; a controller comprising a beamformer integrated circuit, the controller mounted on the first face of the substrate; a plurality of amplifiers mounted on the first face of the substrate and electrically coupled to the controller; and a heat spreader arranged over the controller and the plurality of amplifiers. In certain embodiments, the heat spreader forms a continuous piece of material that covers the controller and the plurality of amplifiers. The heat spreader may comprise one or more of copper, silicon carbide, or aluminum. In certain embodiments, a thermal interface material is arranged between the heat spreader and one or more of the controller and the plurality of amplifiers. In certain embodiments, the SiP device further comprises an overmold on the substrate and around lateral edges of the heat spreader. In certain embodiments, at least a portion of the heat spreader is uncovered by the overmold. In certain embodiments, the heat spreader and the overmold are coplanar along a top surface of the SiP device. In certain embodiments, the heat spreader forms a recess within the heat spreader and the recess is registered with the controller. In certain embodiments, the beamformer integrated circuit comprises a silicon-based complementary metal-oxide-semiconductor (CMOS) device and the plurality of amplifiers comprises gallium arsenide (GaAs) based devices. In certain embodiments, the beamformer integrated circuit comprises a hybrid beamformer device. In certain embodiments, a length and width of the SiP device are sized less than a wavelength of a 40 GHz signal. In certain embodiments, a gap formed between the controller and each amplifier of the plurality of amplifiers on the substrate is no more than 500 microns.

In another aspect, an active antenna system comprises: an antenna board comprising a first face and a second face that opposes the first face; a plurality of antennas on the first face of the antenna board; and a plurality of SiP devices on the second face of the antenna board, wherein each SiP device of the plurality of SiP devices comprises a beamformer integrated circuit, a plurality of amplifiers, and a heat spreader and each SiP device of the plurality SiP devices is electrically coupled with one or more antennas of the plurality of antennas. In certain embodiments, each SiP device of the plurality of SiP devices is electrically coupled with the one or more antennas of the plurality of antennas by feed lines that extend through the antenna board. In certain embodiments, each SiP device of the plurality of SiP devices is electrically coupled with at least two antennas of the plurality of antennas. In certain embodiments, all lateral edges of at least one SiP device of the plurality of SiP devices are nonparallel with all lateral edges of the antenna board. In certain embodiments, the active antenna system further comprises a housing wherein the antenna board is mounted to the housing such that the heat spreader of each SiP device is arranged closer to the housing than the antenna board. In certain embodiments, the beamformer integrated circuit comprises a silicon-based complementary metal-oxide-semiconductor (CMOS) device and the plurality of amplifiers comprises gallium arsenide (GaAs) based devices.

In another aspect, a method comprises: providing a substrate comprising a first face and a second face that opposes the first face; mounting a plurality of electronic devices on the first face of the substrate; depositing a thermal interface material over the plurality of electronic devices; pressing a heat spreader against the thermal interface material to compress the thermal interface material against the plurality of electronic devices; and curing the thermal interface material while the heat spreader is pressed against the thermal interface material. In certain embodiments, the plurality of electronic devices comprise a beamformer integrated circuit and a plurality of amplifiers. In certain embodiments, the method further comprises etching at least one recess in the heat spreader wherein pressing the heat spreader against the thermal interface material comprises registering the recess with at least one electronic device of the plurality of electronic devices. In certain embodiments, the method further comprises applying and curing an overmold on the substrate and around lateral edges of the heat spreader such that a portion of the heat spreader is exposed through the overmold. In certain embodiments, the heat spreader is part of a lead frame that includes a plurality of heat spreaders and the overmold is applied and cured around the plurality of heat spreaders.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Cellular networks continue to evolve to meet the ever increasing demands of modern mobile communication. As such, cellular networks, including fifth generation (5G) and beyond, are being developed with increasing bandwidths and expansion into the millimeter wave spectrum. As used herein, the term "millimeter wave" or "millimeter band" generally refers to a band of frequencies in the electromagnetic spectrum from 30 to 300 gigahertz (GHz). Advanced antenna systems are needed to keep up with evolving cellular network requirements and may include massive multiple-input and multiple-output (MIMO) and phased-array antenna systems at cell towers for increased capacity. Beamforming technology may be employed with such antenna systems to limit interference and direct data streams in targeted directions. At millimeter wave frequencies, lattice spacing between phased-array antennas becomes small (e.g., 3.75 mm for 39 GHz). In order to reduce feed losses, power amplification and beamforming devices are required that provide large amounts of power within form factors that are scaled in a similar manner to the lattice spacing of phased-array antennas. In this regard, devices and systems required for 5G technology are becoming increasingly smaller and more complex.

According to embodiments disclosed herein, devices are disclosed that include power amplifiers and controllers such as beamformer integrated circuits that are integrated together into system-in-package (SiP) device arrangements. Packaging and thermal management configurations are disclosed that allow a plurality of power amplifiers and a beamformer integrated circuit to operate efficiently while in close proximity to one another. In certain embodiments, heat spreaders are disclosed that are incorporated within SiP devices and exposed at top surfaces of the SiP devices to effectively dissipate heat. Heat spreaders may be provided as part of a lead frame that allows multiple SiP devices to be uniformly assembled with dimensions sized for high frequency applications, including millimeter wave operation.

As used herein, the term "SiP device" generally refers to a number of integrated circuits of different functions that are incorporated into a single package. A SiP device may also be referred to as one or more of a SiP module, a SiP chip, a SiP die, or a SiP component in various applications. In certain embodiments disclosed herein, a SiP device includes a plurality of amplifiers, or power amplifiers, that include one or more Group III-V semiconductor materials such as gallium arsenide (GaAs) and gallium nitride (GaN) based devices. SiP devices may also include a controller integrated circuit that includes a beamformer integrated circuit. In certain embodiments, a beamformer integrated circuit may be configured as one or more of an analog beamformer in the radio frequency (RF) domain, a digital beamformer in baseband, or a hybrid beamformer device that includes a combination of analog and digital beamformer circuitry. Beamformer integrated circuits may also be referred to as beamformers or beamformer chips in various applications.

In certain embodiments, a beamformer integrated circuit may include one or more of a silicon-based complementary metal-oxide-semiconductor (CMOS) device, a silicon germanium (SiGe) device, and circuitry thereof.

Figure 1A:
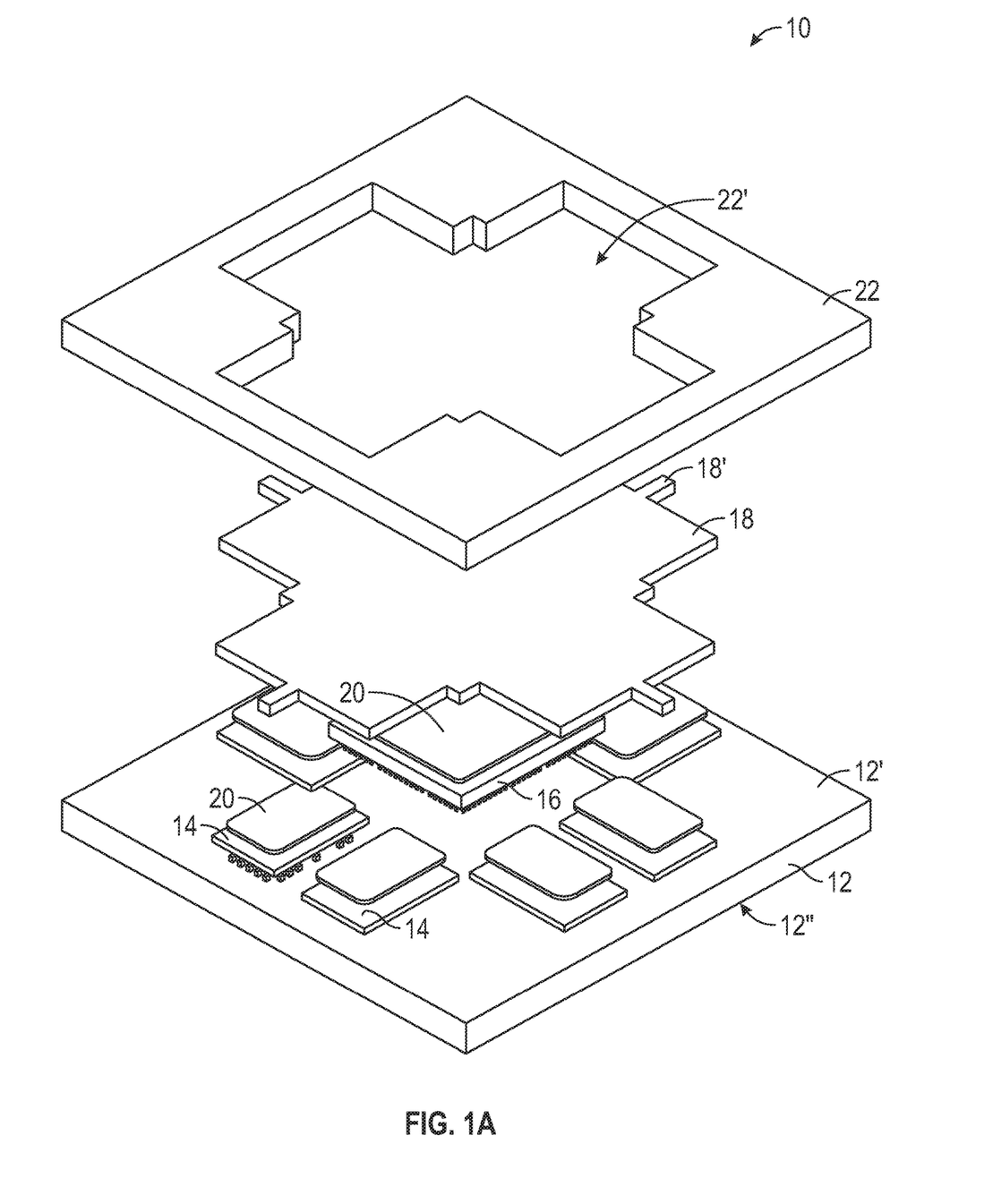
FIG. 1A is a topside exploded perspective view of a system-in-package (SiP) device according to embodiments disclosed herein.

FIG. 1A is a topside exploded perspective view of a SiP device 10 according to embodiments disclosed herein. The SiP device 10 includes a substrate 12 that forms a first face 12' and a second face 12" that generally opposes the first face 12'. The substrate 12 may comprise a laminate material of one or more alternating layers or sheets of conductive and non-conductive materials with matched or similar coefficients of thermal expansion. The substrate 12 may provide mechanical support and electrical connections such that the SiP device 10 forms a ball grid array (BGA) package. In certain embodiments, the substrate 12 may comprise a printed circuit board that provides mechanical support and electrical connections for the SiP device 10. A plurality of amplifiers 14, such as power amplifiers and/or low noise amplifiers, are mounted on the first face 12' such that the plurality of amplifiers 14 are arranged around and in close proximity to lateral edges of a controller 16. In certain embodiments, the controller 16 comprises a beamformer integrated circuit and is also mounted on the first face 12' of the substrate 12. By arranging the plurality of amplifiers 14 and the controller 16 in close proximity to one another, the SiP device 10 may be suitably sized for use with phased-array antennas having small lattice spacing. The plurality of amplifiers 14 and the controller 16 may be flip-chip mounted to the substrate 12 such that electrical connections are made without the use of wirebonds. Flip-chip mounting may allow the plurality of amplifiers 14 and the controller 16 to be spaced closer together and may also provide improved signal fidelity in certain applications. In other embodiments, one or more electronic devices may be mounted to the substrate 12 with wirebonds for one or more electrical connections.

As illustrated in FIG. 1A, a heat spreader 18 is arranged over the controller 16 and the plurality of amplifiers 14. The heat spreader 18 comprises a thermally conductive material capable of dissipating heat generated by the closely spaced amplifiers 14 and controller 16. In this regard, the heat spreader 18 is positioned over and thermally coupled to the amplifiers 14 and controller 16. The heat spreader 18 may form a shape that corresponds to the layout of the amplifiers 14 and controller 16. In certain embodiments, the heat spreader 18 is a continuous piece of material that covers the amplifiers 14 and controller 16. In other embodiments, the heat spreader 18 comprises multiple individual pieces that collectively form the heat spreader 18. In certain embodiments, the heat spreader 18 comprises a metal such as copper (Cu), silicon carbide (SiC), Cu—Ni alloys, aluminum (Al), and Al alloys, among others. For high volume manufacturing, the heat spreader 18 may initially be formed as a part of a lead frame that includes a plurality of heat spreaders 18 connected by tabs 18'. Such tabs 18' are usually clipped or disconnected from one another to singulate individual heat spreaders 18 after device assembly. In other embodiments, the heat spreader 18 may comprise other materials, such as thermally conductive ceramics and/or plastics. When the heat spreader 18 is positioned within the SiP device 10, a thermal interface material 20 may be provided between the heat spreader 18 and one or more of the amplifiers 14 and the controller 16 to reduce mechanical stress and improve reliability. In certain embodiments, the thermal interface material 20 comprises a thermally conductive silicone with a softness that acts to buffer mechanical stress between the heat spreader 18 and the amplifiers 14 and the controller 16, although other materials are possible. The SiP device 10 may further comprise an overmold 22 that is arranged on the substrate 12 and around lateral edges of the heat spreader 18 for mechanical support and protection. In particular, the overmold 22 may be positioned to prevent lift-off of the heat spreader 18, thereby securing mechanical and thermal coupling between the heat spreader 18 and the amplifiers 14 and the controller 16. The overmold 22 may additionally be provided around and between the amplifiers 14 and the controller 16, such that the overmold 22 and the heat spreader 18 enclose the amplifiers 14 and the controller 16 within the SiP device 10. In certain embodiments, the overmold 22 comprises a material such as an epoxy, or a silicone that may include silica or ceramic fillers to improve strength and thermal conductivity. The overmold 22 forms an opening 22' such that the portions of the heat spreader 18 are uncovered by the overmold 22 and fill the opening 22' in order to allow heat dissipation though the heat spreader 18 from a topside of the SiP device 10.

Figure 1B:
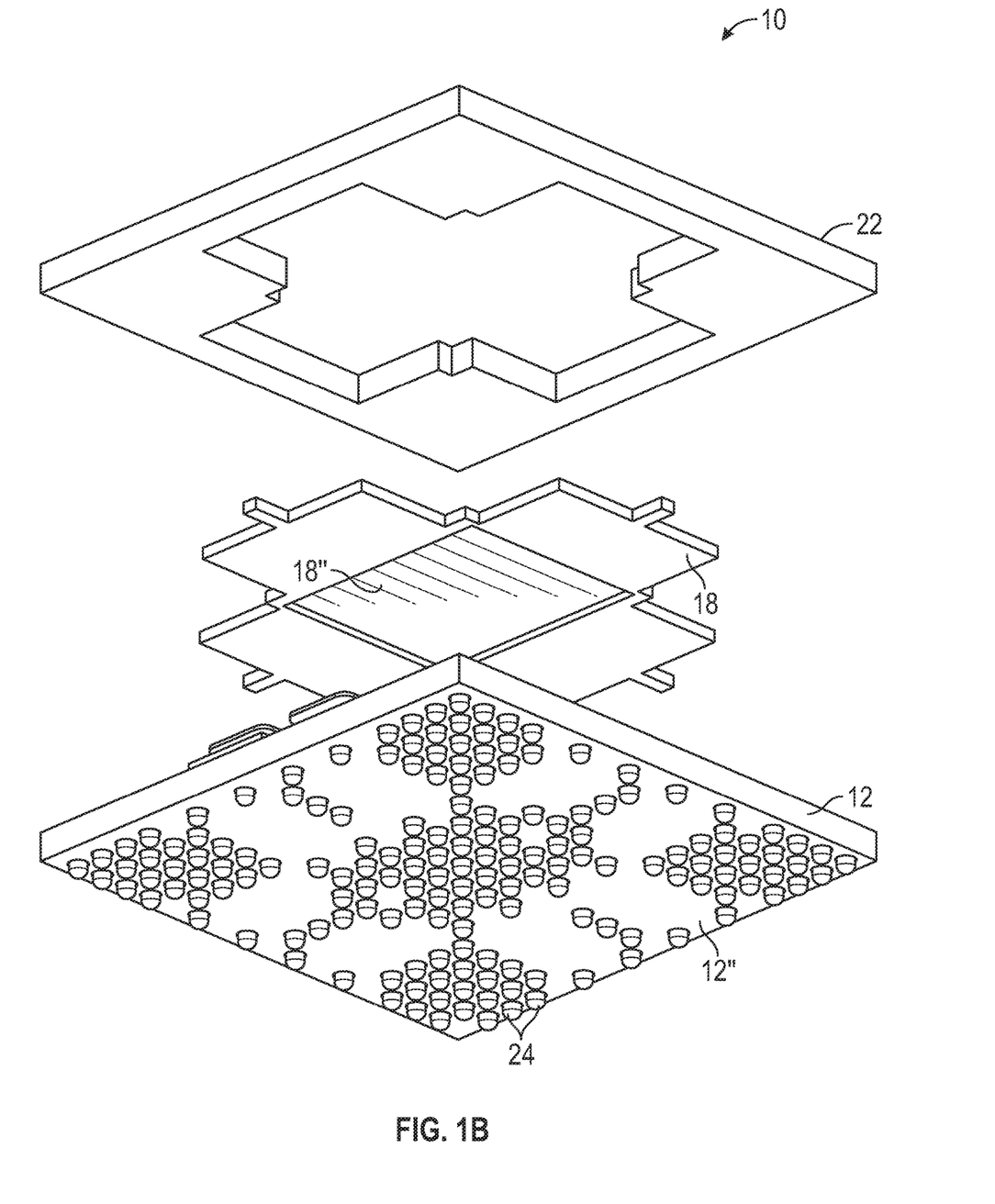
FIG. 1B is a backside exploded perspective view of the SiP device of FIG. 1A according to embodiments disclosed herein.

FIG. 1B is a backside exploded perspective view of the SiP device 10 of FIG. 1A according to embodiments disclosed herein. As illustrated, the heat spreader 18 forms a recess 18" or a pocket that extends partially within the heat spreader 18. In certain applications, electronic devices and/or chips (e.g., the amplifiers 14 and the controller 16 of FIG. 1A) that are mounted on the substrate 12 may not have uniform heights or thicknesses. As such, the recess 18" may be arranged to be aligned or registered with one or more electronic devices having the greatest heights from the substrate 12. In FIG. 1B, the recess 18" is arranged to correspond with the controller (16 of FIG. 1A) for embodiments where the controller (16 of FIG. 1A) has a greater height than the plurality of amplifiers (14 of FIG. 1A). Accordingly, the heat spreader 18 may be arranged such that the controller (16 of FIG. 1A) at least partially extends into the recess 18" when assembled such that the controller (16 of FIG. 1A) is thermally coupled within the recess 18" and the plurality of amplifiers (14 of FIG. 1A) are thermally coupled with the heat spreader 18 outside of the recess 18". The recess 18" may be formed by applying a selective etching process to the heat spreader 18 such that the recess 18" extends partially within the heat spreader 18. In certain applications, such an etching process may be referred to as a half-etch or a half-etching process. While only one recess 18" is illustrated in FIG. 1B, the heat spreader 18 may form multiple recesses 18" or a single recess 18" in a different location, depending on the heights of various electronic devices mounted on the substrate 12. In certain embodiments, the recess 18" may be registered with one or more of the amplifiers (14 of FIG. 1A). As such, the shape and quantity of recesses formed in the heat spreader 18 may be tailored to different configurations to improve thermal coupling uniformity between electronic devices of different sizes and shapes. As illustrated in FIG. 1B, a grid array of solder balls 24 may be provided on the second face 12" of the substrate 12 such that the SiP device 10 forms a BGA package.

Figure 1C:
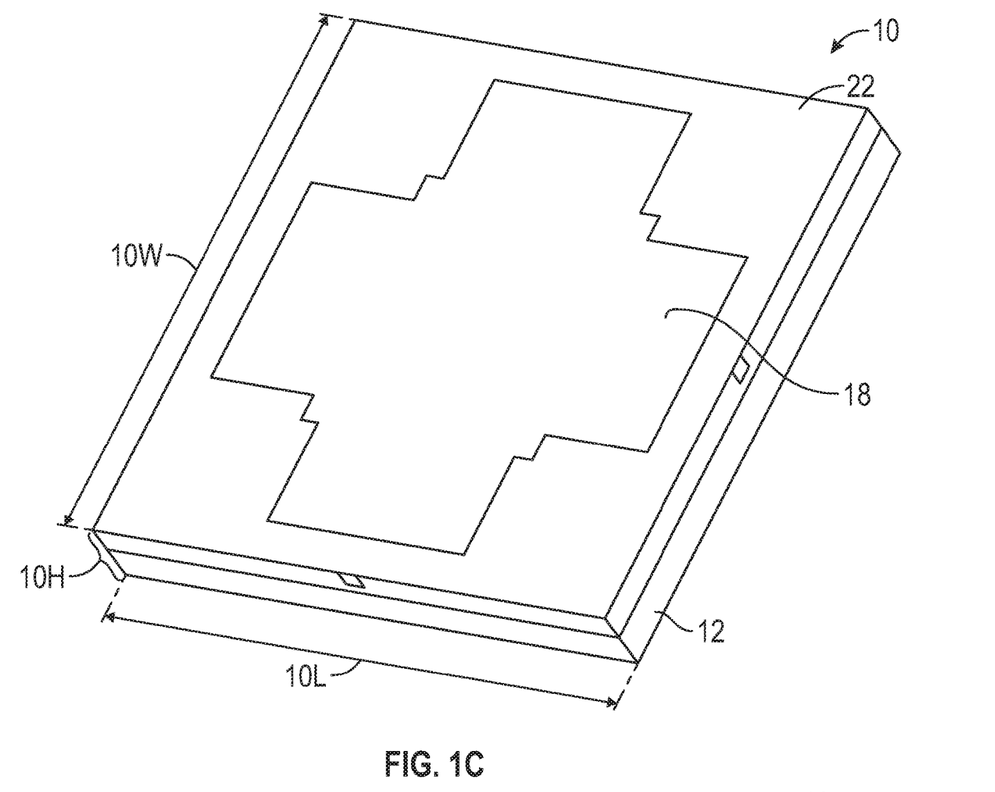
FIG. 1C is a topside perspective view of the assembled SiP device of FIG. 1A according to embodiments disclosed herein.

FIG. 1C is a topside perspective view of the assembled SiP device 10 of FIG. 1A according to embodiments disclosed herein. By forming the heat spreader 18 and the overmold 22 over the substrate 12 as described above, the SiP device 10 is formed with a thin and flat profile that may be sized for millimeter wave operation. In certain embodiments, the SiP device 10 may form a length 10L, a width 10W, and a height 10H that are sized for use in 5G networks with millimeter wave operation. In certain embodiments, the length 10L and width 10W may be sized less than the wavelength of a 40 GHz signal where the length 10L and the width 10W are both sized at 7 mm or less while the height is sized at 1 mm. For such small dimensions, the portion of the heat spreader 18 that is exposed through the overmold 22 may provide an effective path for heat to dissipate away from the substrate 12 during operation.

Figure 2:
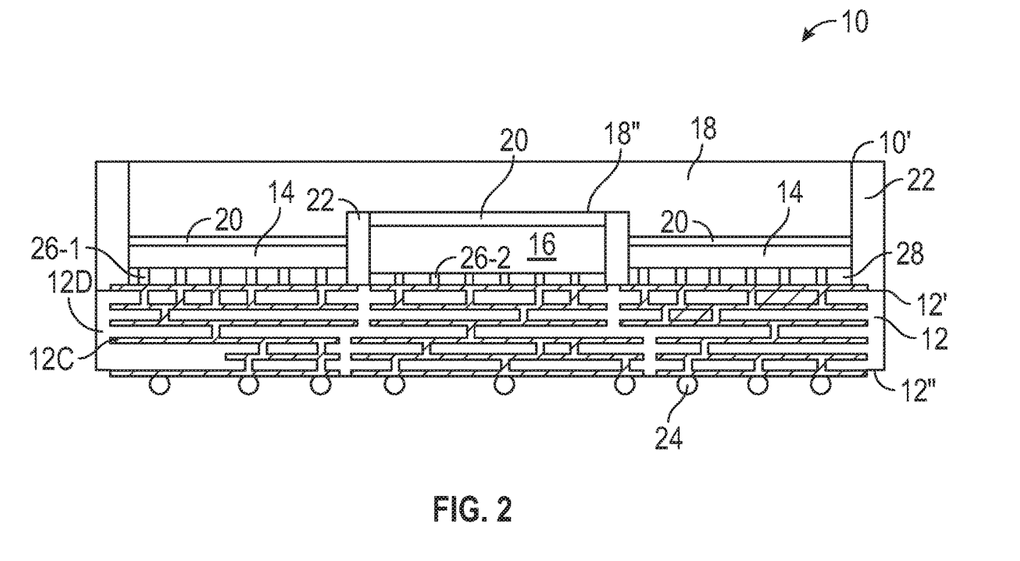
FIG. 2 is a generalized cross-sectional illustration of a SiP device similar to FIG. 1A.

FIG. 2 is a generalized cross-sectional illustration of a SiP device 10 similar to FIG. 1A. The substrate 12 may be formed as a laminate structure with alternating conductive layers 12C and dielectric layers 12D. The illustration of FIG. 2 is meant to be general in nature and the specific layer arrangement of conductive layers 12C and dielectric layers 12D may vary depending on the application. For BGA applications, the grid array of solder balls 24 is provided on the second face 12" of the substrate 12 for mounting with another surface. In FIG. 2, the controller 16 and the amplifiers 14 are flip-chip mounted to the substrate 12 by way of one or more electrical connectors 26-1, 26-2. In particular, one or more first electrical connectors 26-1 are provided between each amplifier 14 and the substrate 12 and one or more second electrical connectors 26-2 are provided between the controller 16 and the substrate 12. The electrical connectors 26-1, 26-2 may comprise metal pillars or posts such as Cu pillars and the like for forming soldered or bonded electrical connections with the substrate 12. The SiP device 10 may further comprise an underfill material 28 that is arranged to fill spaces and gaps between the substrate 12 and the controller 16 and the amplifiers 14. In this manner, the underfill material 28 is arranged to fill spaces around the electrical connectors 26-1, 26-2. In certain embodiments, the underfill material 28 is an electrically insulating adhesive that helps maintain the integrity of the electrical connectors 26-1, 26-2. The thermal interface material 20 may be arranged between the heat spreader 18 and each of the controller 16 and the amplifiers 14 to improve thermal coupling. In order to provide low thermal resistance, the thermal interface material 20 should be as thin as possible while still filling spaces between the heat spreader 18 and the controller 16 and amplifiers 14. As illustrated, the recess 18" of the heat spreader 18 corresponds to the component that has the greatest height or thickness above the substrate 12, which is the controller 16 in this example. By forming the recess 18" in such a manner, portions of the heat spreader 18 are able to be arranged closer to the devices with smaller heights above the substrate 12, which are the amplifiers 14 in this example. Accordingly, the amount of thermal interface material 20 required to thermally couple the amplifiers 14 to the heat spreader 18 may be reduced, thereby decreasing thermal resistance in these areas. While only the controller 16 is illustrated with a different height in FIG. 2, the concepts disclosed herein are applicable to embodiments where any number devices with differing heights are mounted within a common package and a heat spreader is formed with corresponding recesses having differing depths. After arranging the heat spreader 18 over the substrate 12, the overmold 22 may then be formed or molded around lateral edges of the heat spreader 18, over portions of the substrate 12, and between the controller 16 and the amplifiers 14. The overmold 22 may be injected into a mold cavity over the substrate 12 and around the heat spreader 18 and subsequently cured. In certain embodiments, the heat spreader 18 and the overmold 22 may be coplanar with one another along a top surface 10' of the SiP device 10 such that portions of the heat spreader 18 are exposed at the top surface 10' of the SiP device 10.

As disclosed herein, methods for assembling or manufacturing the SiP package 10 may include providing the substrate 12, mounting a plurality of electronic devices (e.g., the controller 16 and the amplifiers 14 in FIG. 2) on the first face 12' of the substrate 12, depositing the thermal interface material 20 over the electronic devices, pressing the heat spreader 18 against the thermal interface material 20 to compress the thermal interface material 20 against the electronic devices, and curing the thermal interface material 20 while the heat spreader 18 is pressed against the thermal interface material 20. By curing the thermal interface material 20 while it is compressed by the heat spreader 18, uniformity of spacing between the heat spreader 18 and the various electronic devices (e.g., the controller 16 and the amplifiers 14) may be improved.

Figure 3A:
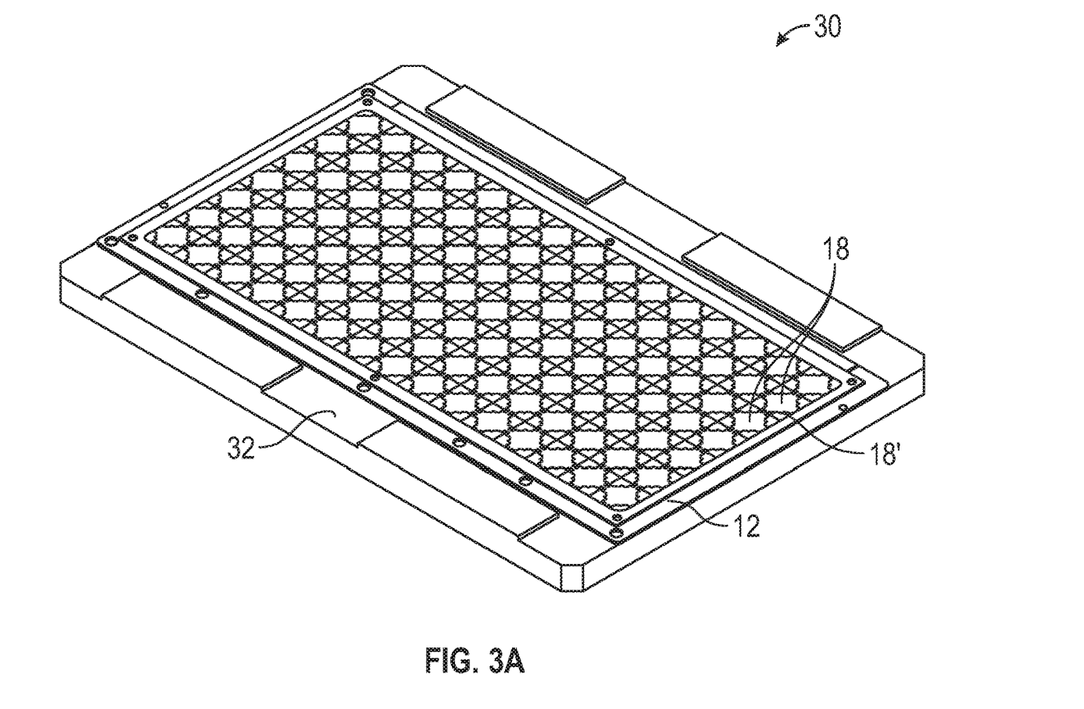
FIG. 3A and FIG. 3B are perspective view illustrations of a fixture or tool for compressing and curing thermal interface material according to embodiments disclosed herein.
Figure 3B:
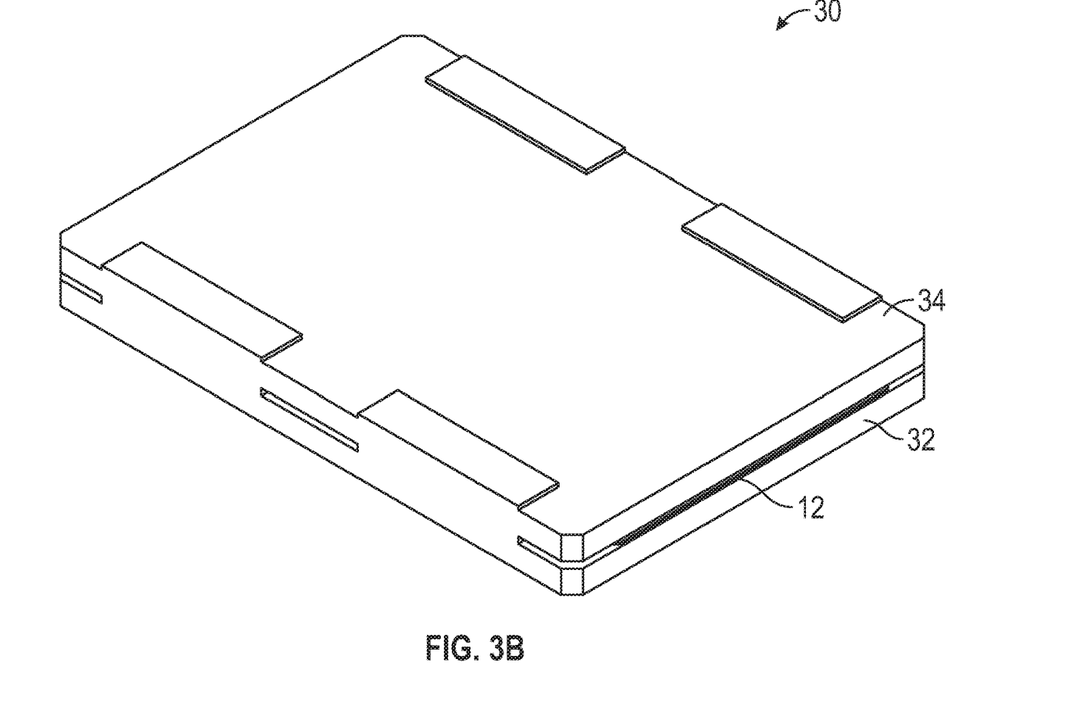

FIG. 3A and FIG. 3B are perspective view illustrations of a fixture 30 or tool for compressing and curing a thermal interface material according to embodiments disclosed herein. The fixture 30 comprises a first plate 32 on which the substrate 12 is placed. In FIG. 3A, the substrate 12 is formed of a larger piece of substrate material for simultaneously assembling a plurality of the SiP devices (10 of FIG. 1A). Additionally, a plurality of the heat spreaders 18 are formed as part of a lead frame such that the tabs 18' are connected between adjacent heat spreaders 18. As illustrated, the lead frame of heat spreaders 18 is placed on the substrate 12 such that a location for each individual heat spreader 18 corresponds with a location where an individual SiP device 10 will be formed. In this regard, each individual heat spreader 18 in FIG. 3A covers a portion of the substrate 12 that includes the thermal interface material 20, the controller 16, and the amplifiers 14 as illustrated in FIG. 2. In FIG. 3B, a second plate 34 is positioned on the first plate 32 to press the lead frame of heat spreaders 18 against the underlying thermal interface material (20 in FIG. 2). In this regard, the second plate 34 is configured to apply an even force across all heat spreaders 18 of the lead frame to provide a uniform height or spacing of the heat spreaders 18 relative to the substrate 12. While the second plate 34 is held in place, the underlying thermal interface material (20 in FIG. 2) is cured to secure the uniform heights between the heat spreaders 18 and the substrate 12. After curing, the substrate 12 may be removed from the fixture 30 for further manufacturing steps.

Figure 3C:
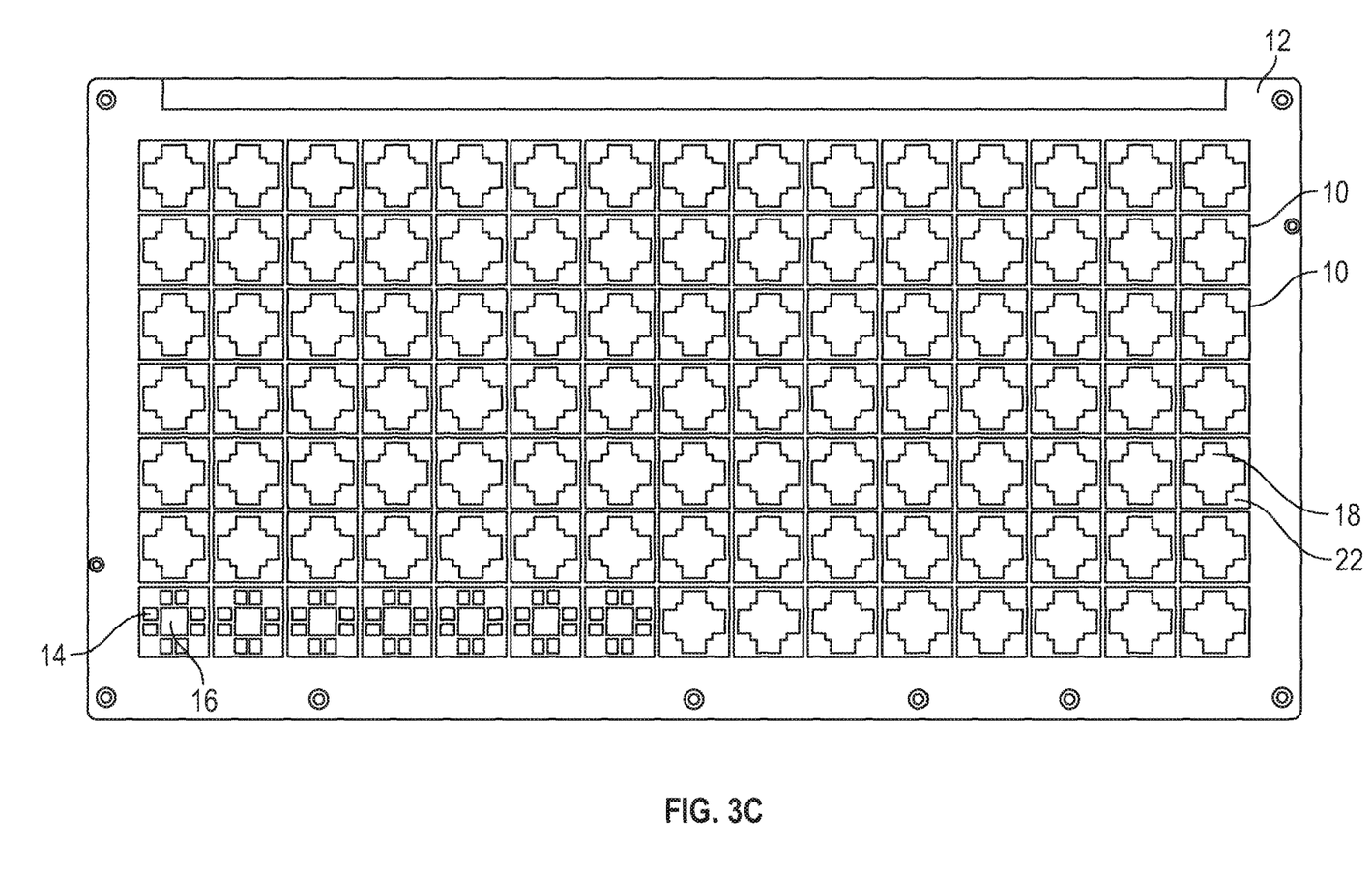
FIG. 3C is a top view of the substrate of FIGS. 3A and 3B after removal from the fixture or tool of FIG. 3B.

FIG. 3C is a top view of the substrate 12 after removal from the fixture 30 of FIG. 3B. As illustrated, the overmold 22 may be applied and cured around lateral edges of the heat spreaders 18 and across the substrate 12 to form an array of the SiP devices 10. In order to show the location of the controller 16 and amplifiers 14 for each SiP device 10, several of the SiP devices 10 are illustrated at the bottom left of the substrate 12 without a corresponding heat spreader 18 and overmold 22. After forming the overmold 22, the substrate 12 may then be singulated to separate the SiP devices 10 from one another. Singulation may be performed by a sawing process that passes in columns and rows between the SiP devices 10. The tabs 18' as illustrated in FIG. 3A may be broken or severed by the singulation process or by a different step that precedes singulation. By simultaneously assembling multiple SiP devices 10 in this manner, the SiP devices 10 may accordingly be provided with flat, consistent and uniform dimensions relative to one another for the next level system assembly.

Figure 4:
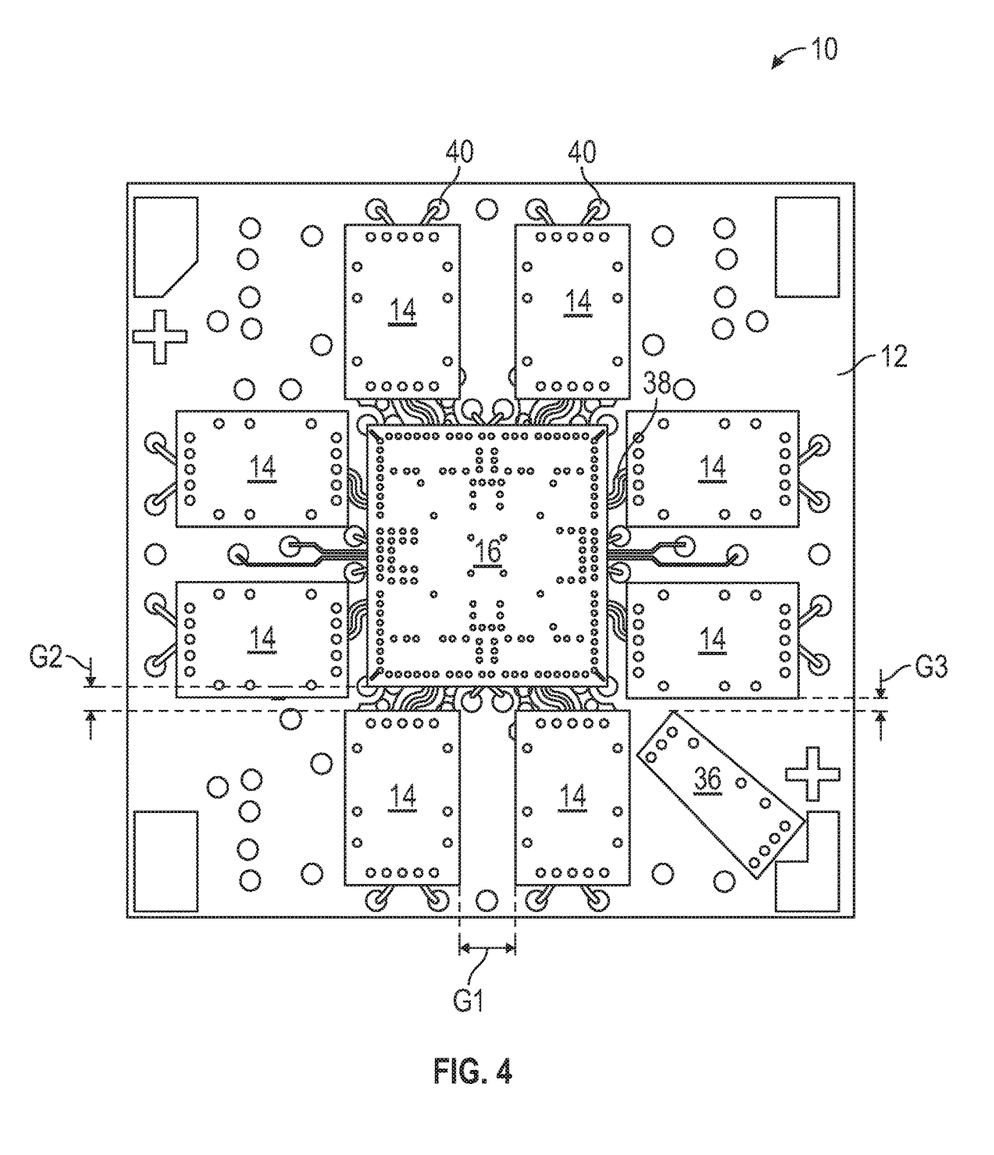
FIG. 4 is a top view of a layout arrangement for a controller and a plurality of amplifiers for the SiP device of FIG. 1A.

FIG. 4 is a top view of a layout arrangement for the controller 16 and the plurality of amplifiers 14 for the SiP device 10 of FIG. 1A. In FIG. 4, the controller 16 is positioned at a center of the substrate 12 and the plurality of amplifiers 14 are arranged around lateral edges of the controller 16 on the substrate 12 in a windmill or wagon wheel configuration. In this manner, each of the amplifiers 14 may be positioned as close as possible to the controller 16 and to other adjacent amplifiers 14 for higher frequency applications, such as millimeter wave. In particular, a first gap G1 may be formed between adjacent amplifiers 14 and a second gap G2 may be formed between the controller 16 and one or more of the amplifiers 14. In certain embodiments, an additional controller 36, such as an integrated circuit configured to control one or more of the amplifiers 14, may also be arranged on the substrate 12 such that a third gap G3 is formed between the additional controller 36 and one or more of the amplifiers 14. In certain embodiments, the gaps G1, G2, G3, may all be formed in a range including 0 microns (µm) to 500 µm. Such small spacing may provide a package that is suitably sized for high frequency operation. As such, distances of electrical traces 38 between the controller 16 and the amplifiers 14 are reduced, thereby providing decreased signal losses associated with traces. Additionally, a single step process may be provided for flowing the underfill material (28 of FIG. 2) underneath the controllers 16, 36 and the amplifiers 14, thereby reducing manufacturing costs. In certain embodiments, one or more of the electronic devices (e.g., the controllers 16, 36 and the amplifiers 14) may be formed with a non-square or non-rectangular shape to accommodate the layout of multiple electronic devices within the SiP device 10. Irregular shapes, such as non-square or non-rectangular, for electronic devices may be formed by laser dicing techniques. By way of example, the additional controller 36 is illustrated with an irregular shape in order fit between two of the amplifiers 14 along a bottom right corner of the SiP device 10. For operation with an external antenna array (not shown), antenna feed ports 40 are arranged on the substrate 12 for providing connections between each amplifier 14 and a corresponding antenna of the external antenna array. For high frequency applications, the small size of the SiP device 10 provides the antenna feed ports 40 with spacings suitable for coupling with narrow-spaced antennas of the external antenna array.

Figure 5A:
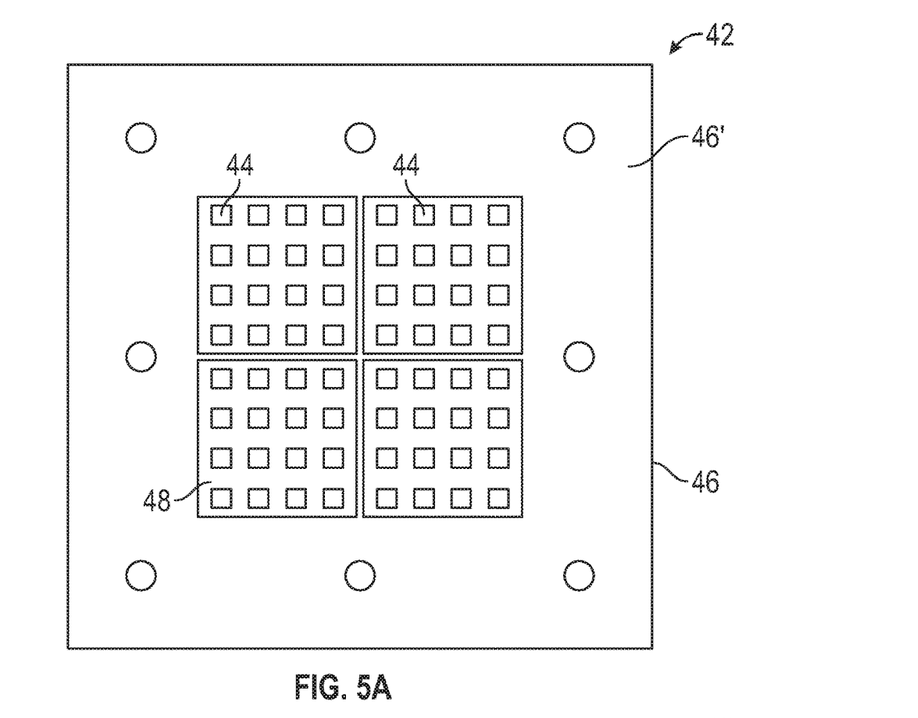
FIG. 5A is a topside view of an active antenna system according to embodiment disclosed herein.
Figure 5B:
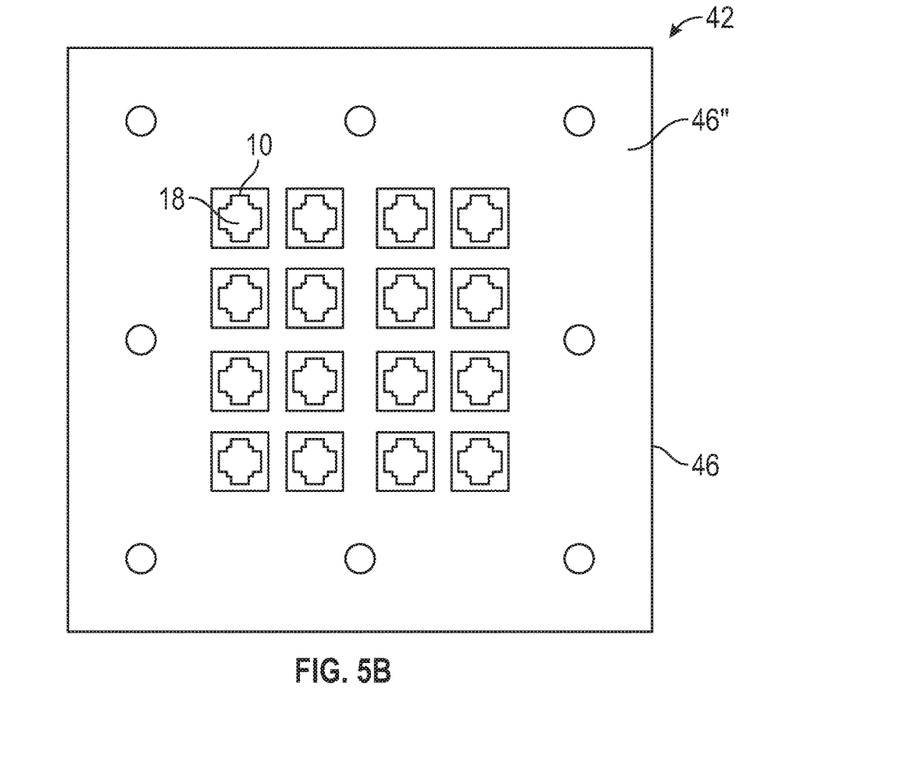
FIG. 5B is a backside view of the active antenna system of FIG. 5A.

FIG. 5A is a topside view of an active antenna system 42 according to embodiment disclosed herein. The active antenna system 42 includes a plurality of antennas 44 arranged on a first face 46' of an antenna board 46. In certain embodiments, the plurality of antennas 44 forms a phased-array antenna with a lattice spacing between adjacent antennas 44 that is configured for high frequency operation, such as millimeter wave operation. Several antenna modules 48 may be arranged together on the antenna board 46 to form a larger antenna array. In certain embodiments, each antenna module 48 may form a patch antenna array. The antenna board 46 may comprise a laminate structure such as a printed circuit board and the like. FIG. 5B is a backside view of the active antenna system 42 of FIG. 5A. As illustrated, a plurality of the SiP devices 10 as previously described may be mounted on a second face 46" of the antenna board 46, wherein the second face 46" opposes or is opposite the first face 46' of FIG. 5A. In this regard, each of the SiP devices 10 may be electrically coupled with one or more antennas 44 by electrical paths that extend through the antenna board 46. As such, electrical paths between SiP devices 10 and corresponding antennas 44 are shorter for reduced losses and the overall size of the active antenna system 42 can be reduced for millimeter wave operation. In this configuration, the heat spreader 18 for each of the SiP devices 10 is accordingly positioned to draw or dissipate heat away from the second face 46" of the antenna board 46.

Figure 6A:
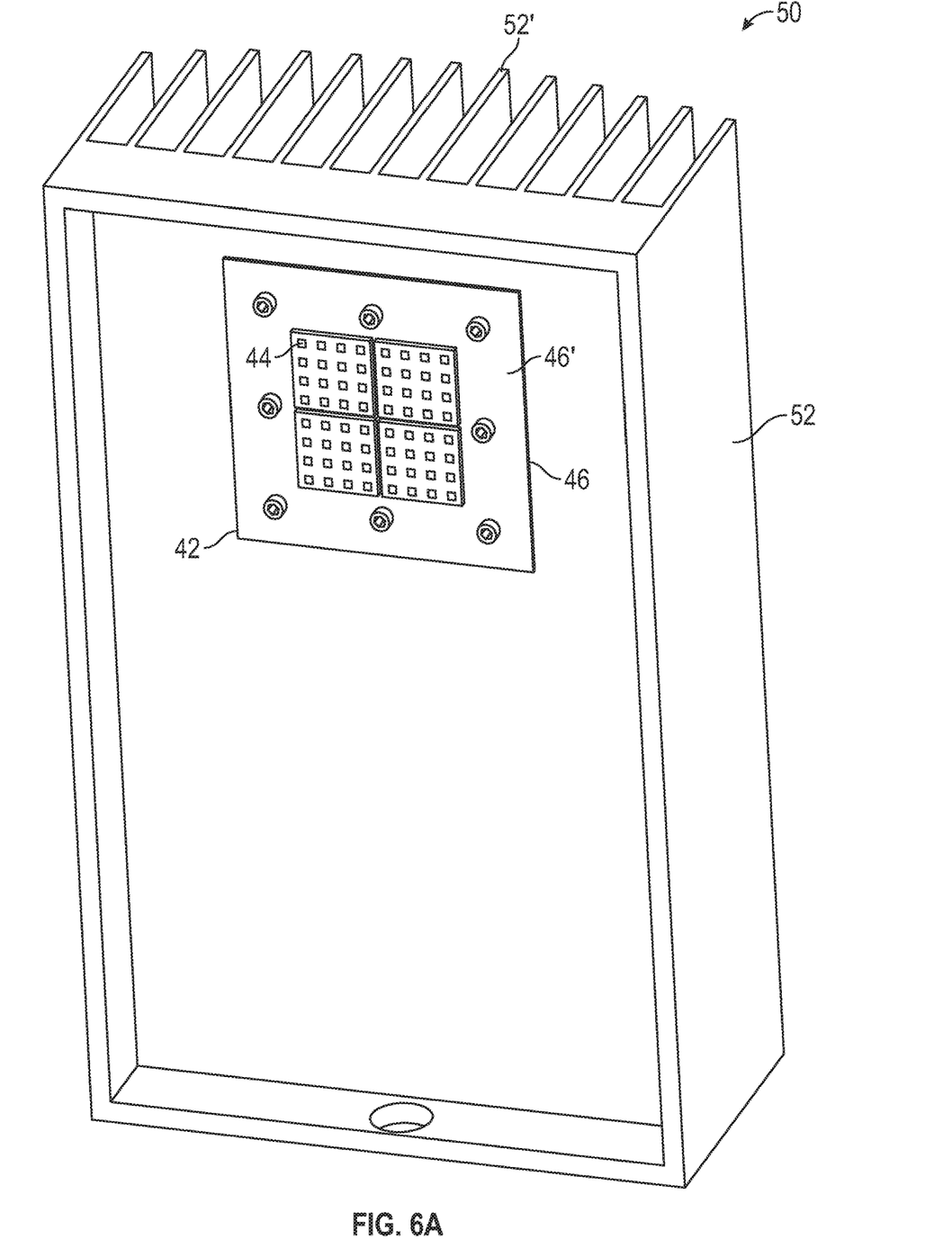
FIG. 6A is a perspective view of an antenna fixture that includes the active antenna system of FIG. 5A.

FIG. 6A is a perspective view of an antenna fixture 50 that includes the active antenna system 42 of FIG. 5A. The antenna board 46 may be mechanically attached or mounted to a housing 52 of the antenna fixture 50 by bolts, screws, or the like. As illustrated, the first face 46' of the antenna board 46 is arranged to face away from the housing 52 to position the plurality of antennas 44 for signal transmissions and/or receptions. In this manner, the second face (46" of FIG. 5B) of the antenna board 46 is arranged between the first face 46' and the housing 52, thereby positioning the heat spreader 18 of each SiP device 10 of FIG. 5B closer to the housing 52 than the antenna board 46. In certain embodiments, the housing 52 comprises a highly thermally conductive material. The housing 52 may also comprise a thermal pad material arranged to improve thermal coupling between the housing 52 and the active antenna system 42. In certain applications, the housing 52 may form a heat sink that is attached or coupled to another fixture housing. The housing 52 may further form one or more heat dissipation features 52', such as heat sink fins and the like for further thermal management of the antenna board 46.

Figure 6B:
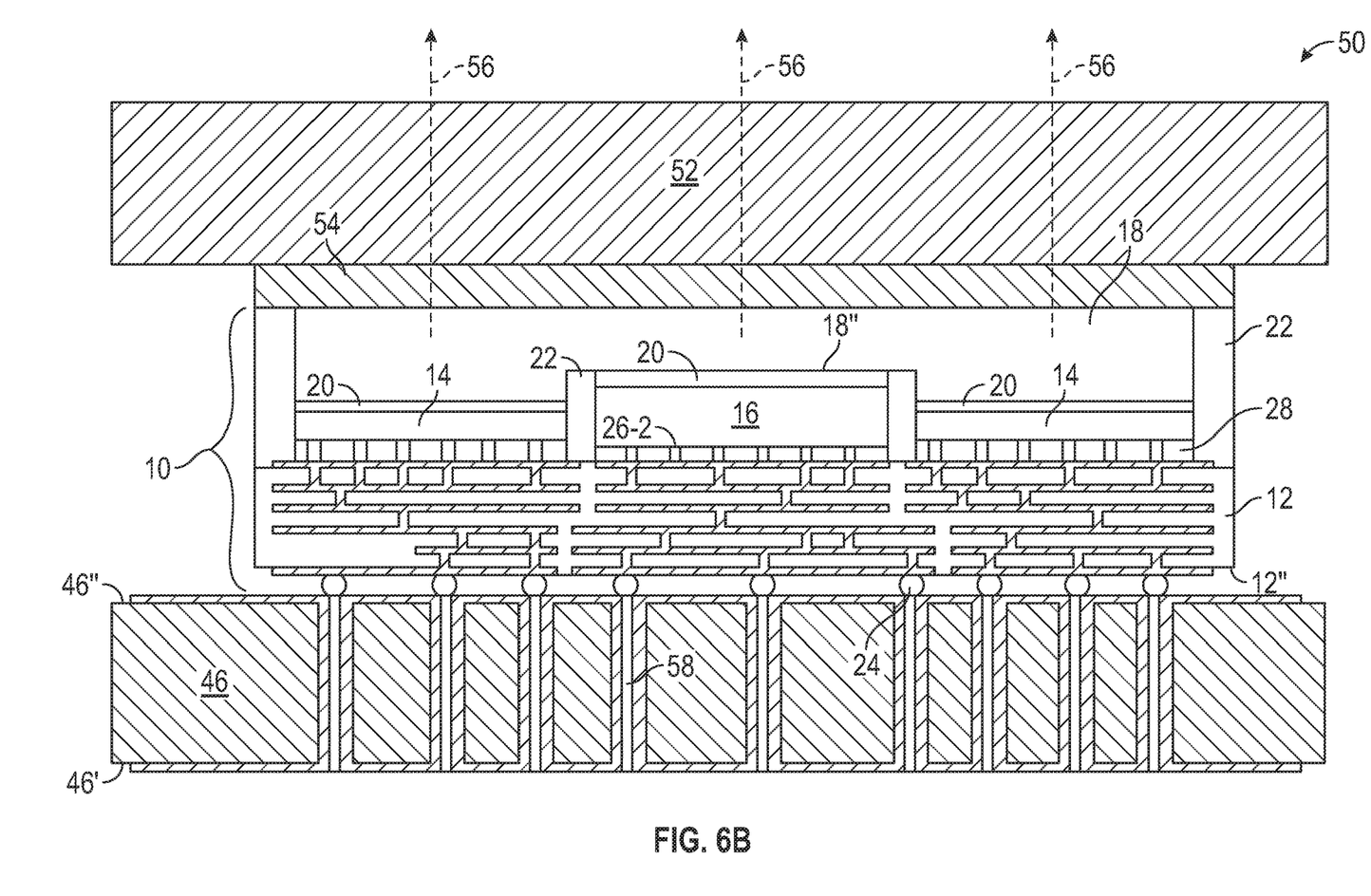
FIG. 6B is a partial cross-sectional illustration representing a mounting arrangement of a SiP device on an antenna fixture that is similar to FIG. 6A.

FIG. 6B is a partial cross-sectional illustration representing a mounting arrangement of the SiP device 10 on the antenna fixture 50 that is similar to FIG. 6A. As illustrated, the antenna board 46 is mounted to the housing 52 such that the second face 46" of the antenna board 46 is between the housing 52 and the first face 46' of the antenna board. In this manner, the heat spreader 18 of the SiP device 10 may be thermally coupled to the housing 52. In certain embodiments, the heat spreader 18 may be thermally coupled to the housing 52 by way of an additional thermal interface material 54 that is arranged between the heat spreader 18 and the housing 52. The additional thermal interface material 54 may comprise a similar or the same material as the thermal interface material 20 in certain embodiments. In such a configuration, the SiP device 10 may be sandwiched between the antenna board 46 and the housing 52. For millimeter wave applications, the SiP device 10 is formed with a small height or thickness (e.g., 1 mm as described for FIG. 1C), thereby allowing the SiP device 10 to fit in the space between the antenna board 46 and the housing 52 with a low profile. Accordingly, the SiP device 10 may be coupled to an array of antennas (44 of FIG. 5A) provided on the first face 46' of the antenna board 46 while a thermal path 56 is provided from the controller 16 and the amplifiers 14 in a direction away the antenna board 46 and toward the housing 52. As further illustrated in FIG. 6B, the grid array of solder balls 24 of the SiP device 10 may be mounted on one or more corresponding vias 58 that are provided through the antenna board 46 to form feed lines for antennas (44 of FIG. 5A) that have short and direct paths through the antenna board 46, thereby reducing feed losses associated with longer feed lines.

Figure 7A:
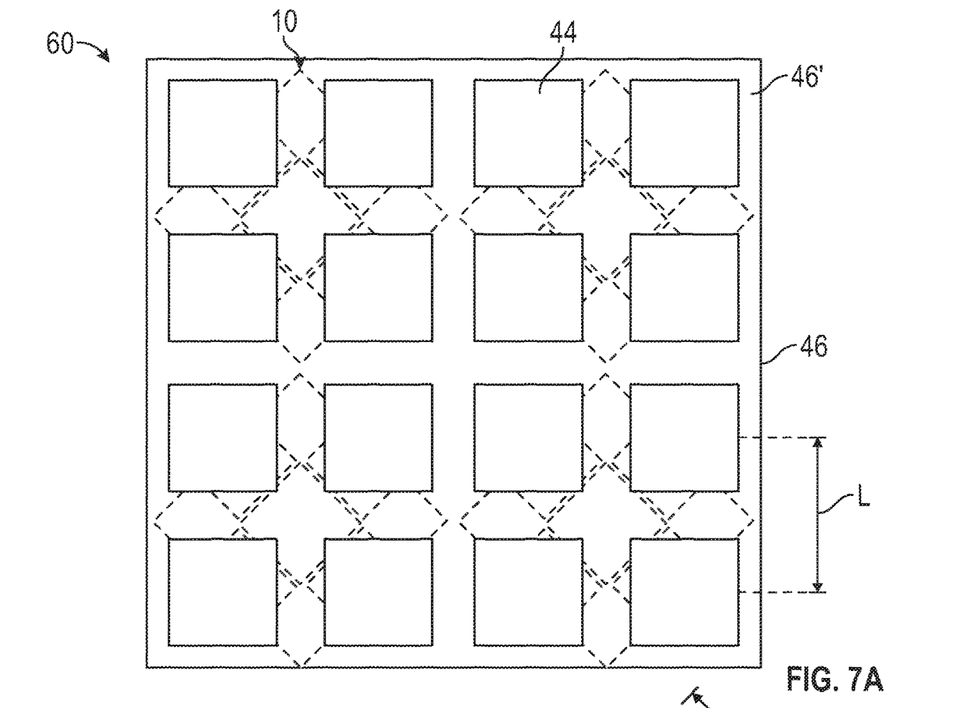
FIG. 7A a top view of an active antenna system that includes an alternative mounting arrangement for SiP devices compared with the active antenna system of FIGS. 5A and 5B.

FIG. 7A a top view of an active antenna system 60 that includes an alternative mounting arrangement for the SiP devices 10 compared with the active antenna system 42 of FIGS. 5A and 5B. The active antenna system 60 includes the plurality of antennas 44 arranged in an array on the first face 46' of the antenna board 46 as described for FIG. 5A. An antenna lattice spacing L is defined as a pitch between center points of adjacent antennas 44 and typically corresponds to a predetermined operating frequency. In certain phased array applications, the antenna lattice spacing L may be set equal to a value of one half a wavelength ($\lambda/2$) of a target operating frequency. For millimeter wave applications, the antenna lattice spacing L becomes notably small. By way of example, for a 30 GHz operating frequency, the $\lambda/2$ value sets the lattice spacing L at 5 mm. The SiP devices 10 are arranged on the second face (46" of FIG. 7B) and are electrically coupled to at least one antenna 44 in certain embodiments, or at least two or more antennas 44 in further embodiments. For illustrative purposes, the antenna board 46 is drawn as partially transparent to show the position of the SiP devices 10 relative to the antennas 44. In certain, each SiP device 10 is registered with one or more of the antennas 44 through the antenna board 46 such that feed lines between the SiP devices 10 and the antennas 44 are configured as short as possible. By way of example, FIG. 7A illustrates an embodiment where each SiP device 10 is registered with four of the antennas 44.

Figure 7B:
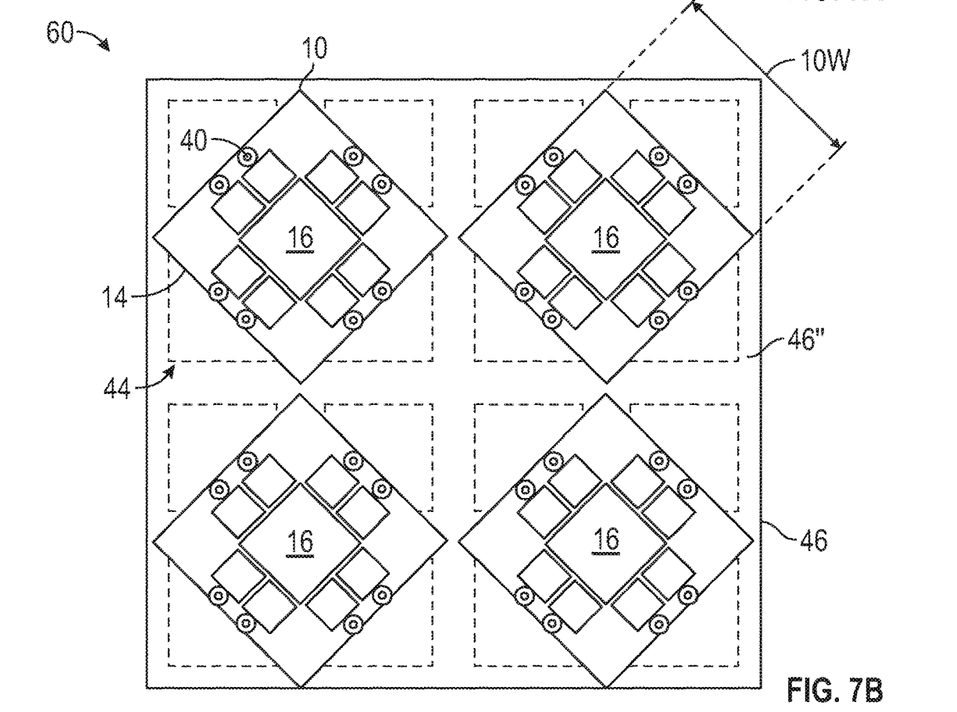
FIG. 7B is a bottom view of the active antenna system of FIG. 7A.

FIG. 7B is a bottom view of the active antenna system 60 of FIG. 7A. Each SiP device 10 includes the controller 16 and the plurality of amplifiers 14 as previously described. For illustrative purposes, the heat spreader 18 and the overmold 22 for each SiP device 10 are not shown, but would be present in practice as illustrated in FIG. 1C. Notably, each SiP device 10 is mounted on the second face 46" in an orientation that is rotated 45 degrees from the antennas 44 on the first face 46'. In certain embodiments, each SiP device 10 may be oriented with a rotation in any amount such that all lateral edges of each SiP device 10 are misaligned or nonparallel with all lateral edges of one or more of the antenna board 46 and the antennas 44. This allows a pair of the amplifiers 14 to be electrically coupled to each antenna 44 with short feed lines that extends through the antenna board 46. For millimeter wave operation, dimensions of the SiP devices 10 are small to correspond with small values for the antenna lattice spacing (L of FIG. 7A). For the example illustrated in FIG. 7B where each SiP device 10 is electrically coupled with four antennas 44, the width 10W of each SiP device 10 may be set with a value that positions the antenna feed ports 40 at or close to the center of each antenna 44. In this manner the width 10W may correspond to the distance from a center point of diagonally-spaced antennas 44. For the 30 GHz example described for FIG. 7A that sets the lattice spacing L at 5 mm for adjacent antennas 44, a distance from the center point of diagonal antennas 44, or the target width 10W for the SiP device 10, would be the square root of the sum of $5^2$ plus $5^2$. As such, the width 10W for each SiP device 10 may be set at 7.1 mm for 30 GHz operation.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A system-in-package (SiP) device comprising:
    a substrate comprising a first face and a second face that opposes the first face;
    a controller comprising a beamformer integrated circuit, the controller mounted on the first face of the substrate;
    a plurality of amplifiers mounted on the first face of the substrate and electrically coupled to the controller;
    a heat spreader arranged over the controller and the plurality of amplifiers; and
    an overmold that is on the substrate and on lateral edges of the heat spreader, wherein the heat spreader and the overmold are coplanar along a top surface of the SiP device.

2. The SiP device of claim 1, wherein the heat spreader forms a continuous piece of material that covers the controller and the plurality of amplifiers.

3. The SiP device of claim 1, wherein the heat spreader comprises one or more of copper, silicon carbide, or aluminum.

4. The SiP device of claim 1, further comprising a thermal interface material that is arranged between the heat spreader and one or more of the controller and the plurality of amplifiers.

5. The SiP device of claim 1, wherein at least a portion of the heat spreader is uncovered by the overmold.

6. The SiP device of claim 1, wherein the heat spreader forms a recess within the heat spreader and the recess is registered with the controller.

7. The SiP device of claim 1, wherein the beamformer integrated circuit comprises a silicon-based complementary metal-oxide-semiconductor (CMOS) device and the plurality of amplifiers comprises gallium arsenide (GaAs) based devices.

8. The SiP device of claim 1, wherein the beamformer integrated circuit comprises a hybrid beamformer device.

9. The SiP device of claim 1, wherein a length and width of the SiP device are sized less than a wavelength of a 40 GHz signal.

10. The SiP device of claim 1, wherein a gap formed between the controller and each amplifier of the plurality of amplifiers on the substrate is no more than 500 microns.

11. An active antenna system comprising:
an antenna board comprising a first face and a second face that opposes the first face;
a plurality of antennas on the first face of the antenna board; and
a plurality of system-in-package (SiP) devices on the second face of the antenna board, wherein each SiP device of the plurality of SiP devices comprises a beamformer integrated circuit, a plurality of amplifiers, a heat spreader, and an overmold that is on lateral edges of the heat spreader such that a surface of the heat spreader is coplanar with a surface of the overmold, and wherein each SiP device of the plurality SiP devices is electrically coupled with one or more antennas of the plurality of antennas.

12. The active antenna system of claim 11, wherein each SiP device of the plurality of SiP devices is electrically coupled with the one or more antennas of the plurality of antennas by feed lines that extend through the antenna board.

13. The active antenna system of claim 11, wherein each SiP device of the plurality of SiP devices is electrically coupled with at least two antennas of the plurality of antennas.

14. The active antenna system of claim 11, wherein all lateral edges of at least one SiP device of the plurality of SiP devices are nonparallel with all lateral edges of the antenna board.

15. The active antenna system of claim 11, further comprising a housing wherein the antenna board is mounted to the housing such that the heat spreader of each SiP device is arranged closer to the housing than the antenna board.

16. The SiP device of claim 11, wherein the beamformer integrated circuit comprises a silicon-based complementary metal-oxide-semiconductor (CMOS) device and the plurality of amplifiers comprises gallium arsenide (GaAs) based devices.

17. A method comprising:
providing a substrate comprising a first face and a second face that opposes the first face;
mounting a plurality of electronic devices on the first face of the substrate;
depositing a thermal interface material over the plurality of electronic devices;
pressing a heat spreader against the thermal interface material to compress the thermal interface material against the plurality of electronic devices;
curing the thermal interface material while the heat spreader is pressed against the thermal interface material; and
applying and curing an overmold on the substrate and on lateral edges of the heat spreader such that the heat spreader and the overmold are coplanar along a top surface of the overmold.

18. The method of claim 17, wherein the plurality of electronic devices comprise a beamformer integrated circuit and a plurality of amplifiers.

19. The method of claim 17, further comprising etching at least one recess in the heat spreader wherein pressing the heat spreader against the thermal interface material comprises registering the recess with at least one electronic device of the plurality of electronic devices.

20. The method of claim 17, wherein a portion of the heat spreader is exposed through the overmold.

21. The method of claim 20, wherein the heat spreader is part of a lead frame that includes a plurality of heat spreaders and the overmold is applied and cured around the plurality of heat spreaders.

* * * * *